United States Patent
Kato et al.

(10) Patent No.: US 6,301,801 B1
(45) Date of Patent: Oct. 16, 2001

(54) VACUUM PROCESSING APPARATUS AND OPERATING METHOD THEREFOR

(76) Inventors: Shigekazu Kato, 12-4, 3-chome, Toyo, Kudamatsu-Shi, Yamaguchi-Ken (JP); Kouji Nishihata, 6-37, 3-chome, Toishi, Tokuyama-Shi, Yamaguchi-Ken (JP); Tsunehiko Tsubone, 1-47, Iwagari-Cho, Hikari-Shi, Yamaguchi-Ken (JP); Atsushi Itou, 499-3, Ikunoya, Kudamatsu-Shi, Yamaguchi-Ken (JP)

( * ) Notice: Subject to any disclaimer, the term of this patent is extended or adjusted under 35 U.S.C. 154(b) by 0 days.

(21) Appl. No.: 09/552,572

(22) Filed: Apr. 19, 2000

Related U.S. Application Data

(62) Division of application No. 09/461,432, filed on Dec. 16, 1999, which is a continuation of application No. 09/177,495, filed on Oct. 23, 1998, now Pat. No. 6,012,235, which is a continuation of application No. 09/061,062, filed on Apr. 16, 1998, now Pat. No. 5,950,330, which is a continuation of application No. 08/882,731, filed on Jun. 26, 1997, now Pat. No. 5,784,799, which is a division of application No. 08/593,870, filed on Jan. 30, 1996, now Pat. No. 5,661,913, which is a continuation of application No. 08/443,039, filed on May 17, 1995, now Pat. No. 5,553,396, which is a division of application No. 08/302,443, filed on Sep. 9, 1994, now Pat. No. 5,457,896, which is a continuation of application No. 08/096,256, filed on Jul. 26, 1993, now Pat. No. 5,349,762, which is a continuation of application No. 07/751,951, filed on Aug. 29, 1991, now Pat. No. 5,314,509.

(30) Foreign Application Priority Data

Aug. 29, 1990 (JP) ................................. 2-225321

(51) Int. Cl.[7] .................................... F26B 5/04

(52) U.S. Cl. ................... 34/406; 34/92; 34/228

(58) Field of Search ............... 34/406, 92, 228, 34/229; 414/939, 940; 134/902

(56) References Cited

U.S. PATENT DOCUMENTS

| 3,652,444 | 2/1972 | Lester et al. |
|---|---|---|
| 3,981,791 | 9/1976 | Rosvold. |
| 4,138,306 | 2/1979 | Niwa .................................. 156/345 |

(List continued on next page.)

FOREIGN PATENT DOCUMENTS

| 20246453 | 4/1987 | (EP) . |
|---|---|---|
| 20381338 | 5/1990 | (EP) . |
| 57-29577 | 2/1982 | (JP) . |

(List continued on next page.)

OTHER PUBLICATIONS

R.P.H. Chang, "Multipurpose plasma reactor for materials research and processing", J. Vac. Sci. Technol., vol. 14, No. 1, Jan./Feb. 1977, pp. 278–280.

(List continued on next page.)

Primary Examiner—Stephen Gravini

(57) ABSTRACT

This invention relates to a vacuum processing apparatus having vacuum processing chambers the insides of which must be dry cleaned, and to a method of operating such an apparatus. When the vacuum processing chambers are dry-cleaned, dummy substrates are transferred into the vacuum processing chamber by substrates conveyor means from dummy substrate storage means which is disposed in the air atmosphere together with storage means for storing substrates to be processed, and the inside of the vacuum processing chamber is dry-cleaned by generating a plasma. The dummy substrate is returned to the dummy substrate storage means after dry cleaning is completed. Accordingly, any specific mechanism for only the cleaning purpose is not necessary and the construction of the apparatus can be made simple. Furthermore, the dummy substrates used for dry cleaning and the substrates to be processed do not coexist, contamination of the substrates to be processed due to dust and remaining gas can be prevented and the production yield can be high.

15 Claims, 1 Drawing Sheet

U.S. PATENT DOCUMENTS

| | | |
|---|---|---|
| 4,226,897 | 10/1980 | Coleman . |
| 4,311,427 | 1/1982 | Coad et al. . |
| 4,313,783 | 2/1982 | Davies et al. . |
| 4,313,815 | 2/1982 | Graves, Jr. et al. . |
| 4,318,767 | 3/1982 | Hijikata et al. . |
| 4,449,885 | 5/1984 | Hertel et al. . |
| 4,457,661 | 7/1984 | Flint et al. . |
| 4,534,314 | 8/1985 | Ackley . |
| 4,563,240 | 1/1986 | Shibata et al. . |
| 4,576,698 | 3/1986 | Gallagher et al. ............... 204/192 |
| 4,634,331 | 1/1987 | Hertel . |
| 4,643,629 | 2/1987 | Takahashi et al. ............... 414/331 |
| 4,705,951 | 11/1987 | Layman et al. . |
| 4,715,764 | 12/1987 | Hutchinson . |
| 4,824,309 | 4/1989 | Kakehi et al. ............... 414/217 |
| 4,836,733 | 6/1989 | Hertel et al. . |
| 4,836,905 | 6/1989 | Davis et al. . |
| 4,851,101 | 7/1989 | Hutchinson . |
| 4,895,107 | 1/1990 | Yano et al. . |
| 4,902,934 | 2/1990 | Miyamura et al. . |
| 4,903,937 | 2/1990 | Jakuniec et al. . |
| 4,909,695 | 3/1990 | Hurwitt et al. . |
| 4,911,597 | 3/1990 | Maydan et al. . |
| 4,915,564 | 4/1990 | Eror et al. . |
| 4,917,556 | 4/1990 | Stark et al. . |
| 4,924,890 | 5/1990 | Giles et al. ............... 134/902 |
| 4,936,329 | 6/1990 | Michael et al. ............... 134/902 |
| 4,951,601 | 8/1990 | Maydan et al. ............... 414/217 X |
| 4,969,790 | 11/1990 | Petz et al. . |
| 5,007,981 | 4/1991 | Kawasaki et al. . |
| 5,014,217 | 5/1991 | Savage ............... 364/550 |
| 5,292,393 | 3/1994 | Maydan et al. . |
| 5,351,415 | 10/1994 | Brooks et al. ............... 34/389 |
| 5,452,166 | 9/1995 | Aylwin et al. . |
| 5,462,397 | 10/1995 | Iwabuchi ............... 414/222 |
| 5,504,033 | 4/1996 | Bajor et al. . |
| 5,504,347 | 4/1996 | Jovanovic et al. . |
| 5,509,771 | 4/1996 | Hiroki ............... 414/217 |
| 5,556,714 | 9/1996 | Fukuyama et al. . |
| 5,651,858 | 7/1997 | Lin . |
| 5,675,461 | 10/1997 | Aylwin et al. . |
| 5,685,684 | 11/1997 | Kato et al. ............... 414/217 |

FOREIGN PATENT DOCUMENTS

| | | |
|---|---|---|
| 60-246635 | 12/1985 | (JP) . |
| 62-44571 | 2/1987 | (JP) . |
| 62-50463 | 3/1987 | (JP) . |
| 62-89881 | 4/1987 | (JP) . |
| 62-207866 | 9/1987 | (JP) . |
| 63-153270 | 6/1988 | (JP) . |
| 636582 | 1/1989 | (JP) . |
| 6412037 | 1/1989 | (JP) . |
| 131970 | 2/1989 | (JP) . |
| 131971 | 2/1989 | (JP) . |
| 1135015 | 5/1989 | (JP) . |
| 1-251734 | 10/1989 | (JP) . |
| 1-310553 | 12/1989 | (JP) . |
| 1298180 | 12/1989 | (JP) . |
| 2-61064 | 3/1990 | (JP) . |
| 265252 | 3/1990 | (JP) . |
| 2-106037 | 4/1990 | (JP) . |
| 294647 | 4/1990 | (JP) . |
| 430549 | 4/1992 | (JP) . |
| 8707309 | 5/1987 | (WO) . |

OTHER PUBLICATIONS

Semiconductor Equipment Association of Japan, Terminological Dictionary of Semiconductor Equipment), front, table, p. 183, back, Nov. 20, 1987.

Semiconductor Equipment Association of Japan, "Semiconductor News", vol. 4, pp. 38–43, Apr. 10, 1987 (w/translation).

VACUUM PROCESSING APPARATUS AND OPERATING METHOD THEREFOR

This application is a Divisional application of application Ser. No. 09/461,432, filed Dec. 16, 1999, which is a Continuation application of application Ser. No. 09/177,495, filed Oct. 23, 1998, now U.S. Pat. No. 6,012,235, which is a Continuation application of application Ser. No. 09/061,062, filed Apr. 16, 1998, now U.S. Pat. No. 5,950,330, which is a Continuation application of application Ser. No. 08/882,731, filed Jun. 26, 1997, now U.S. Pat. No. 5,784,799, which is a Divisional application of application Ser. No. 08/593,870, filed Jan. 30, 1996, now U.S. Pat. No. 5,661,913, which is a Continuing application of application Ser. No. 08/443,039, filed May 17, 1995, now U.S. Pat. No. 5,553,396, which is a Divisional application of application Ser. No. 08/302,443, filed Sep. 9, 1994, now U.S. Pat. No. 5,457,896, which is a Continuing application of application Ser. No. 08/096,256, filed Jul. 26, 1993, now U.S. Pat. No. 5,349,762, which is a Continuing application of application Ser. No. 07/751,951, filed Aug. 29, 1991, now U.S. Pat. No. 5,314,509.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparatus and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988. This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual gas used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means for storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
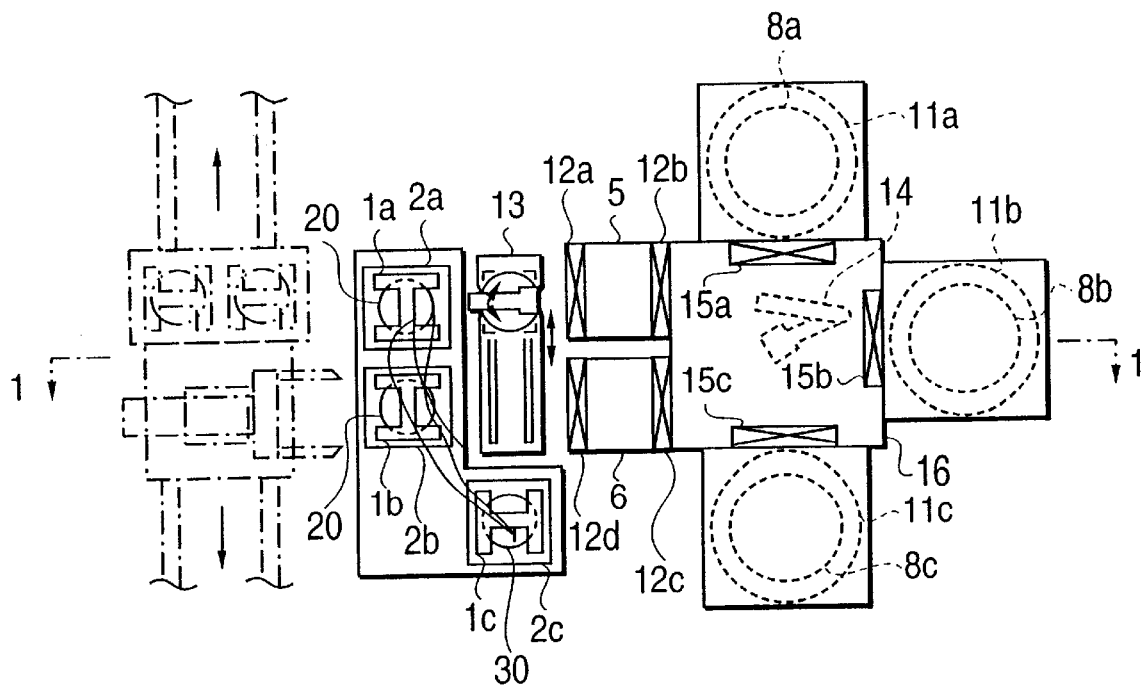
FIG. 1 is a plan view of a dry etching apparatus as an embodiment of a vacuum processing apparatus in accordance with the present invention.
Figure 2:
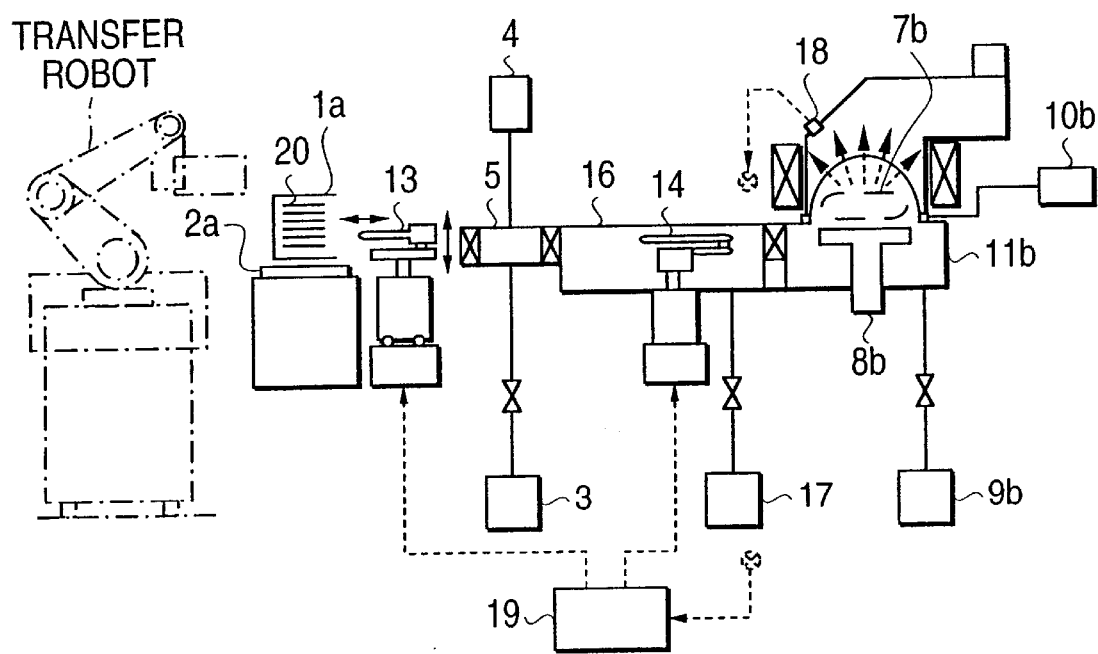
FIG. 2 is a vertical sectional view taken along line 1—1 of FIG. 1.

FIGS. 1 and 2 show a vacuum processing apparatus of the present invention which is, in this case, a dry-etching apparatus for etching wafers, i.e., substrates to be processed by plasma.

Cassette tables 2a to 2c are disposed in an L-shape in this case in positions such that they can be loaded into and unloaded from the apparatus without changing their positions and postures. In other words, the cassettes 1a to 1c are fixed always in predetermined positions on a substantially horizontal plane, while the cassette tables 2a and 2b are disposed adjacent to and in parallel with each other on one of the sides of the L-shape. The cassette table 2c is disposed on the other side of the L-shape. The cassettes 1a and 1b are for storing unprocessed wafers and for recovering the processed wafers. They can store a plurality (usually 25) of wafers 20 as the substrates to be treated. The cassette 1c in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables 2a and 2b, and a conveyor 13 is disposed between the cassette tables 2a, 2b and the load lock chamber 5 and the unload lock chamber 6. The load lock chamber 5 is equipped with an evacuating device 3 and a gas introduction device 4, and can load unprocessed wafers in the vacuum apparatus through a gate valve 12a. The unload lock chamber 6 is similarly equipped with the evacuating device 3 and the gas introduction device 4, and can take out processed wafers to the atmosphere through a gate valve 12d. The conveyor 13 is equipped with a robot having X, Y, Z and θ axes, which operates so as to deliver and receive the wafers 20 between the cassettes 1a, 1b and the load lock and unload lock chambers 5 and 6 and the dummy wafers 30 between the cassette 1c and the load lock and unload lock chambers 5 and 6.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through gate valves 15a, 15b and 15c, respectively. A conveyor 14 capable of delivering the wafers 20 or the dummy wafers 30 from the load lock chamber 5 to the etching chambers 11a, 11b, 11c and of delivering them from the chambers 11a, 11b, 11c to the unload lock chamber 6 is disposed inside the transfer chamber 16. The transfer chamber 16 is equipped with an evacuating device 17 capable of independent evacuation.

The etching chambers 11a, 11b, 11c have the same structure and can make the same processing. The explanation will be given on the etching chamber 11b by way of example. The etching chamber 11b has a sample table 8b for placing the wafers 20 thereon, and a discharge chamber is so provided as to define a discharge portion 7b above the sample table 8b. The etching chamber 11b includes a gas introduction device 10b for introducing a processing gas in the discharge portion 7b and an evacuating device 9b for decreasing the internal pressure of the etching chamber 11b to a predetermined pressure. The etching chamber 11b further includes generation means for generating a microwave and a magnetic field for converting processing gas in the discharge portion 7b to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette 1c and the etching chambers 11a to 11c.

In a vacuum processing apparatus having the construction described above, the cassettes 1a, 1b storing unprocessed wafers are first placed onto the cassette tables 2a, 2b by a line transfer robot which operates on the basis of the data sent from a host control apparatus, or by an operator. On the other hand, the cassette 1c storing the dummy wafers is placed on the cassette table 2c. The vacuum processing apparatus executes the wafer processing or plasma cleaning on the basis of recognition by itself of the production data provided on the cassettes 1a to 1c, of the data sent from the host control apparatus, or of the command inputted by an operator.

For instance, the wafers 20 are sequentially loaded in the order from above into the etching chambers 11a, 11b, 11c by the conveyors 13 and 14, and are etched. The etched wafers are stored in their original positions inside the cassette 1a by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers 11a to 11c. Therefore, the original state must be recovered by removing the adhering matters by plasma cleaning. The controller 19 judges the timing of this plasma cleaning. In this case, a portion through which the plasma light passes is provided in each of the etching chambers 11a to 11c. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing of wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in any position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber 11a through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 1c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism for conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times of use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. A method of transferring a substrate, using apparatus comprising:
    a cassette table for mounting a cassette at a position of which an upper region of the position is open to a cassette transferring path, the cassette receiving plural substrates to be subjected to processing or plural substrates which have been subjected to processing;
    two lock chambers for carrying in and carrying out said substrates to be subjected to processing or said substrates which have been subjected to processing;
    a single atmospheric transferring device for transferring, one by one, a substrate to be subjected to processing or a substrate which has been subjected to processing, between said cassette at said position and said two lock chambers; and
    opening and closing devices provided respectively at a side of the cassette of said two lock chambers and being opened or closed every carrying-in and carrying-out of said substrate to be subjected to processing or said substrate which has been subjected to processing, so as to change over said two lock chambers to being in an atmosphere or in a vacuum, wherein the method comprises the step of:
        carrying in said substrate to be subjected to processing, or carrying out said substrate which has been subjected to processing, one by one, between the two lock chambers in the atmosphere and the cassette at said position, the opening and closing devices being opened and closed every carrying-in and carrying-out of said substrate, one by one.

2. A method of transferring a substrate according to claim 1, wherein one of said two lock chambers has a function of a load lock chamber, and the other of said two lock chambers has a function of an unload lock chamber.

3. A method of transferring a substrate, using apparatus comprising:
    a cassette table for mounting a cassette at a position of which an upper region of the position is open to a cassette transferring path, the cassette receiving plural substrates to be subjected to processing or plural substrates which have been subjected to processing;
    a load lock chamber for carrying in said substrates to be subjected to processing;
    an unload lock chamber for carrying out said substrates which have been subjected to processing;
    a single atmospheric transferring device for transferring one by one a substrate to be subjected to processing or a substrate which has been subjected to processing, between said cassette at said position and said load lock chamber and said unload lock chamber; and
    opening and closing devices provided respectively at a side of the cassette of said load lock chamber and said unload lock chamber and being opened or closed every carrying-in and carrying-out of said substrate to be subjected to processing or said substrate which has been subjected to processing, so as to change over said load lock chamber and said unload lock chamber to be in an atmosphere or in a vacuum, wherein the method comprises the step of:
        carrying in said substrate to be subjected to processing, or carrying out said substrate which has been subjected to processing, one by one, between said load lock chamber and said unload lock chamber in the atmosphere and said cassette at said position, the opening and closing devices being opened and closed every carrying-in and carrying-out of said substrate, one by one.

4. A method of transferring a substrate according to claim 1 or 3, wherein said cassette is maintained in a transfer installation state without a change of position, and wherein a posture of plural cassettes, which are arranged in a cassette transfer space, are installed in a single row.

5. A method of transferring a substrate according to claim 1 or 3, wherein said cassette is mounted on said cassette table according to any one of a mechanical transferring means and a manual transferring means.

6. A method of transferring a substrate according to claim 1 or 3, wherein said carrying-in and said carrying-out of said substrate are performed to carry in and carry out, one by one, according to any one of a recognition of a product information which is given to said cassette, an information which is sent from an upper rank controlling apparatus, and a demand which is inputted manually.

7. A method of transferring a substrate according to claim 1 or 3, wherein said carrying-in and said carrying-out of said substrate are performed to carry said substrate which has been subjected to processing, to an original position at which the substrate was located prior to processing.

8. A method of transferring a substrate, comprising steps of:
    supplying a cassette, which receives plural substrates to be subjected to processing or plural substrates which have been subjected to processing, to a cassette table for mounting said cassette at a position of which an upper region of the position is open to a cassette transferring path;
    transferring a substrate to be subjected to processing or a substrate which has been subjected to processing between the cassette and at least one of two lock chambers which carry in and carry out said substrate to be subjected to processing or said substrate which has been subjected to processing, using a single atmospheric transferring device for transferring one by one between said cassette at said position and said at least one of two lock chambers; and
    opening and closing using opening and closing devices which open or close respectively at a side of the cassette of said two lock chambers, the opening and closing devices being opened or closed every carrying-in and carrying-out of said substrate to be subjected to processing or said substrate which has been subjected to processing, so as to change over said two lock chambers in an atmosphere or in a vacuum, wherein between said two lock chambers in the atmosphere and said cassette at said position, said substrate to be subjected to processing or said substrate which has been subjected to processing is carried in or carried out one by one.

9. An apparatus for transferring a substrate, comprising:

a cassette table for mounting a cassette at a position of which an upper region of the position is open to a cassette transferring path, the cassette receiving plural substrates to be subjected to processing, or plural substrates which have been subjected to processing;

two lock chambers for carrying in and carrying out said substrates to be subjected to processing or said substrates which have been subjected to processing;

a single atmospheric transferring device for transferring one by one a substrate to be subjected to processing or a substrate which has been subjected to processing, between said cassette at said position and said two lock chambers; and opening and closing devices provided respectively at a side of the cassette of said two lock chambers and being opened or closed every carrying-in and carrying-out of said substrate to be subjected to processing or said substrate which has been subjected to processing, so as to change over said two lock chambers in an atmosphere or in a vacuum, wherein between said two lock chambers in the atmosphere and said cassette at said position, said substrate to be subjected to processing or said substrate which has been subjected to processing is carried in or carried out one by one.

10. An apparatus for transferring a substrate according to claim 9, wherein said two lock chambers have a function of a load lock chamber or an unload lock chamber.

11. An apparatus for transferring a substrate, comprising:

a cassette table for mounting a cassette at a position of which an upper region of the position is open to a cassette transferring path, the cassette receiving plural substrates to be subjected to processing or plural substrates which have been subjected to processing;

a load lock chamber for carrying in said substrates to be subjected to processing;

an unload lock chamber for carrying out said substrates which have been subjected to processing;

a single atmospheric transferring device for transferring one by one a substrate to be subjected to processing or a substrate which has been subjected to processing, between said cassette at said position and said load lock chamber and said unload lock chamber; and opening and closing devices provided respectively at a side of the cassette of said load lock chamber and said unload lock chamber and being opened or closed every carrying-in and carrying-out of said substrate to be subjected to processing or said substrate which has been subjected to processing, so as to change over said load lock chamber and said unload lock chamber in an atmosphere or in a vacuum, wherein between said load lock chamber and said unload lock chamber in the atmosphere and said cassette at said position, said substrate to be subjected to processing or said substrate which has been subjected to processing is carried in or carried out one by one.

12. An apparatus for transferring a substrate according to claim 9 or 11, wherein said cassette is maintained in a transfer installation state without a change of position, and wherein a posture of plural cassettes, which are arranged in a cassette transfer space, are installed in a single row.

13. An apparatus for transferring a substrate according to claim 9 or 11, wherein said cassette is mounted on said cassette table according to any one of a mechanical transferring means and a manual transferring means.

14. An apparatus for transferring a substrate according to claim 9 or 11, wherein said carrying-in and said carrying-out of said substrate are performed to carry in and carry out, one by one, according to any one of a recognition of a product information which is given to said cassette, an information which is sent from an upper rank controlling apparatus, and a demand which is inputted manually.

15. An apparatus for transferring of a substrate according to claim 9 or 11, wherein said carrying-in and said carrying-out of said substrate are performed to carry said substrate which has been subjected to processing, to an original position at which the substrate was located prior to processing.

* * * * *